(12) United States Patent
Sarin et al.

(10) Patent No.: US 11,222,699 B2
(45) Date of Patent: *Jan. 11, 2022

(54) TWO-PART PROGRAMMING METHODS

(71) Applicant: MICRON TECHNOLOGY, INC., Boise, ID (US)

(72) Inventors: Vishal Sarin, Saratoga, CA (US); Allahyar Vahidimowlavi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/010,334

(22) Filed: Sep. 2, 2020

(65) Prior Publication Data

US 2020/0402585 A1   Dec. 24, 2020

Related U.S. Application Data

(60) Continuation of application No. 16/298,313, filed on Mar. 11, 2019, now Pat. No. 10,770,145, which is a
(Continued)

(51) Int. Cl.
*G11C 16/10* (2006.01)
*G11C 16/04* (2006.01)
*G11C 16/34* (2006.01)
*G11C 11/56* (2006.01)

(52) U.S. Cl.
CPC .......... *G11C 16/10* (2013.01); *G11C 11/5628* (2013.01); *G11C 16/0408* (2013.01); *G11C 16/0458* (2013.01); *G11C 16/3418* (2013.01); *G11C 16/3427* (2013.01); *G11C 2211/562* (2013.01); *G11C 2211/5622* (2013.01);
(Continued)

(58) Field of Classification Search
CPC . G11C 16/10; G11C 11/5628; G11C 16/0408; G11C 16/0458; G11C 16/3418; G11C 16/3427; G11C 2211/562; G11C 2211/5622; G11C 2211/5642; G11C 2211/5648
See application file for complete search history.

(56) References Cited

U.S. PATENT DOCUMENTS 6,046,935 A    4/2000  Takeuchi et al.
6,233,174 B1   5/2001  Tsujikawa et al.
(Continued)

*Primary Examiner* — Vanthu T Nguyen
(74) *Attorney, Agent, or Firm* — Dicke, Billig & Czaja, PLLC

(57) ABSTRACT

Memory having an array of memory cells might include control logic configured to cause the memory to inhibit memory cells of a first subset of memory cells from programming during each programming pulse of a first plurality of programming pulses and enable those memory cells for programming for at least one programming pulse of a second plurality of programming pulses, inhibit memory cells of a second subset of memory cells from programming during each programming pulse of the second plurality of programming pulses and enable those memory cells for programming for at least one programming pulse of the first plurality of programming pulses, and enable memory cells of a third subset of memory cells for programming during at least one programming pulse of the first plurality of programming pulses and during at least one programming pulse of the second plurality of programming pulses.

21 Claims, 4 Drawing Sheets

Related U.S. Application Data continuation of application No. 15/831,718, filed on Dec. 5, 2017, now Pat. No. 10,249,365, which is a division of application No. 15/287,956, filed on Oct. 7, 2016, now Pat. No. 9,858,991, which is a continuation of application No. 14/725,749, filed on May 29, 2015, now Pat. No. 9,502,101, which is a continuation of application No. 13/334,339, filed on Dec. 22, 2011, now Pat. No. 9,087,600, which is a continuation of application No. 12/274,727, filed on Nov. 20, 2008, now Pat. No. 8,089,805.

(52) U.S. Cl.
 CPC ............... *G11C 2211/5642* (2013.01); *G11C 2211/5648* (2013.01)

(56) References Cited

U.S. PATENT DOCUMENTS

| | | |
|---|---|---|
| 6,876,577 B2 | 4/2005 | Kobayashi et al. |
| 7,224,624 B2 | 5/2007 | Lee et al. |
| 7,301,817 B2 | 11/2007 | Li et al. |
| 7,474,561 B2 | 1/2009 | Li et al. |
| 7,539,052 B2 | 5/2009 | Aritome |
| 7,602,650 B2 | 10/2009 | Jung et al. |
| 7,639,533 B2 | 12/2009 | Chang et al. |
| 7,656,710 B1 | 2/2010 | Wong |
| 7,813,170 B2 | 10/2010 | Shibata |
| 7,839,678 B2 | 11/2010 | Shiga |
| 7,920,420 B2 | 4/2011 | Lee |
| 8,059,456 B2 | 11/2011 | Shlick et al. |
| 2008/0144370 A1 | 6/2008 | Park et al. |
| 2009/0213652 A1 | 8/2009 | Park et al. |

| FIRST VARIATION | |
|---|---|
| $V_{start1}$ | ~17V |
| $V_{stop1}$ | 24V |
| FIRST PARTIC. LEVEL | 8 |
| $V_{start2}$ | 12V |
| $V_{stop2}$ | ~19V |
| SECOND PARTIC. LEVEL | 7 |

| SECOND VARIATION | |
|---|---|
| $V_{start1}$ | 18V |
| $V_{stop1}$ | 24V |
| FIRST PARTIC. LEVEL | 7 |
| $V_{start2}$ | 12V |
| $V_{stop2}$ | 18V |
| SECOND PARTIC. LEVEL | 8-9 |

| THIRD VARIATION | |
|---|---|
| $V_{start1}$ | ~17.5V |
| $V_{stop1}$ | 24V |
| FIRST PARTIC. LEVEL | 7 |
| $V_{start2}$ | 12V |
| $V_{stop2}$ | ~18.5V |
| SECOND PARTIC. LEVEL | 7 |

TWO-PART PROGRAMMING METHODS

RELATED APPLICATIONS

This application is a continuation of Ser. No. 16/298,313, filed on Mar. 11, 2019, and issued as U.S. Pat. No. 10,770,145 on Sep. 8, 2020, which is a continuation of U.S. application Ser. No. 15/831,718, filed Dec. 5, 2017 and issued as U.S. Pat. No. 10,249,365 on Apr. 2, 2019, which is a divisional of U.S. application Ser. No. 15/287,956, filed Oct. 7, 2016 and issued as U.S. Pat. No. 9,858,991 on Jan. 2, 2018, which is a continuation of U.S. application Ser. No. 14/725,749, filed May 29, 2015 and issued as U.S. Pat. No. 9,502,101 on Nov. 22, 2016, which is a continuation of U.S. application Ser. No. 13/334,339, filed Dec. 22, 2011 and issued as U.S. Pat. No. 9,087,600 on Jul. 21, 2015, which is a continuation of U.S. application Ser. No. 12/274,727, filed Nov. 20, 2008 and issued as U.S. Pat. No. 8,089,805 on Jan. 3, 2012, which applications are commonly assigned and incorporated herein by reference in their entirety.

FIELD

The present disclosure relates generally to memories, and in particular, in one or more embodiments, the present disclosure relates to programming flash memories.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage node, such as floating gates or trapping layers or other physical phenomena, determine the data state of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a logical column of memory cells is coupled in parallel with each memory cell coupled to a data line, such as those typically referred to as bit lines. In NAND flash architecture, a column of memory cells is coupled in series with only the first memory cell of the column coupled to a bit line.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit by using such technologies as multilevel cells (MLC). For example, MLC NAND flash memory is a very cost effective non-volatile memory.

Multilevel cells can take advantage of the analog nature of a traditional flash cell by assigning a bit pattern to a specific threshold voltage (Vt) range stored on the cell. This technology permits the storage of two or more bits per cell, depending on the quantity of voltage ranges assigned to the cell and the stability of the assigned voltage ranges during the lifetime operation of the memory cell.

For example, a cell may be assigned four different voltage ranges of 200 mV for each range. Typically, a dead space of 0.2V to 0.4V is between each range to keep the ranges from overlapping. If the voltage stored on the cell is within the first range, the cell is storing a logical 11 state and is typically considered the erased state of the cell. If the voltage is within the second range, the cell is storing a logical 01 state. This continues for as many ranges that are used for the cell provided these voltage ranges remain stable during the lifetime operation of the memory cell.

Since two or more states are stored in each MLC, the width of each of the voltage ranges for each state can be very important. The width is related to many variables in the operation of a memory circuit. For example, a cell could be verified at one temperature and read at a different temperature. The circuitry that determines if the cell is erased or programmed to the correct Vt range has to make that determination. That circuitry has some of its characteristics influenced by temperature. A Vt window is a sum of all of these types of differences, translating into a shift in the perceived window of the Vt. In order for the window to operate, the width of the four states plus a margin between each state should amount to the available window.

MLC memories often use a larger number of Vt ranges than are required to store the bits of data to be stored. For example, 16 ranges may be used in a MLC between −2 volts and +3 volts, to allow for more ranges to be used to program the bits of data that are to be programmed in the memory.

In MLC memories using a number of voltage ranges (also referred to as levels), cells to be programmed to lower levels, for example those cells to be programmed to levels 0-7 of a 16 level memory, are subjected during normal programming sequences to potentially large amounts of disturb due to the high voltages used for programming cells to higher levels such as levels 8-15 of a 16 level memory.

In MLC memories using a number of levels, cells to be programmed to lower levels, especially those cells to be programmed to levels 0-7 of a 16 level memory, are subject to disturbance from programming of upper level cells. For example, cells at level 0 program typically at a control gate voltage of approximately 13-15 volts, whereas the cells at level 15 program typically at a control gate voltage of approximately 22-24 volts, depending upon whether they are fast or slow programming cells. When cells are programmed in a typical programming sequence of applying a series of programming pulses beginning at 12 volts and ending at 24 volts, level 0 cells program first since they program at the lower levels, and are then inhibited because they have reached their level. One problem is that level 0 cells are inhibited, and during programming of the rest of the cells at higher voltages, the level 0 cells are subject to program disturb. Level 0 cells are disturbed more than level 15 cells, since they see a greater number of voltage pulses higher than their level, even if they are inhibited.

For reasons such as those stated above, and for other reasons, such as those stated below, which will become apparent to those skilled in the art upon reading and under-

DETAILED DESCRIPTION

Figure 1:
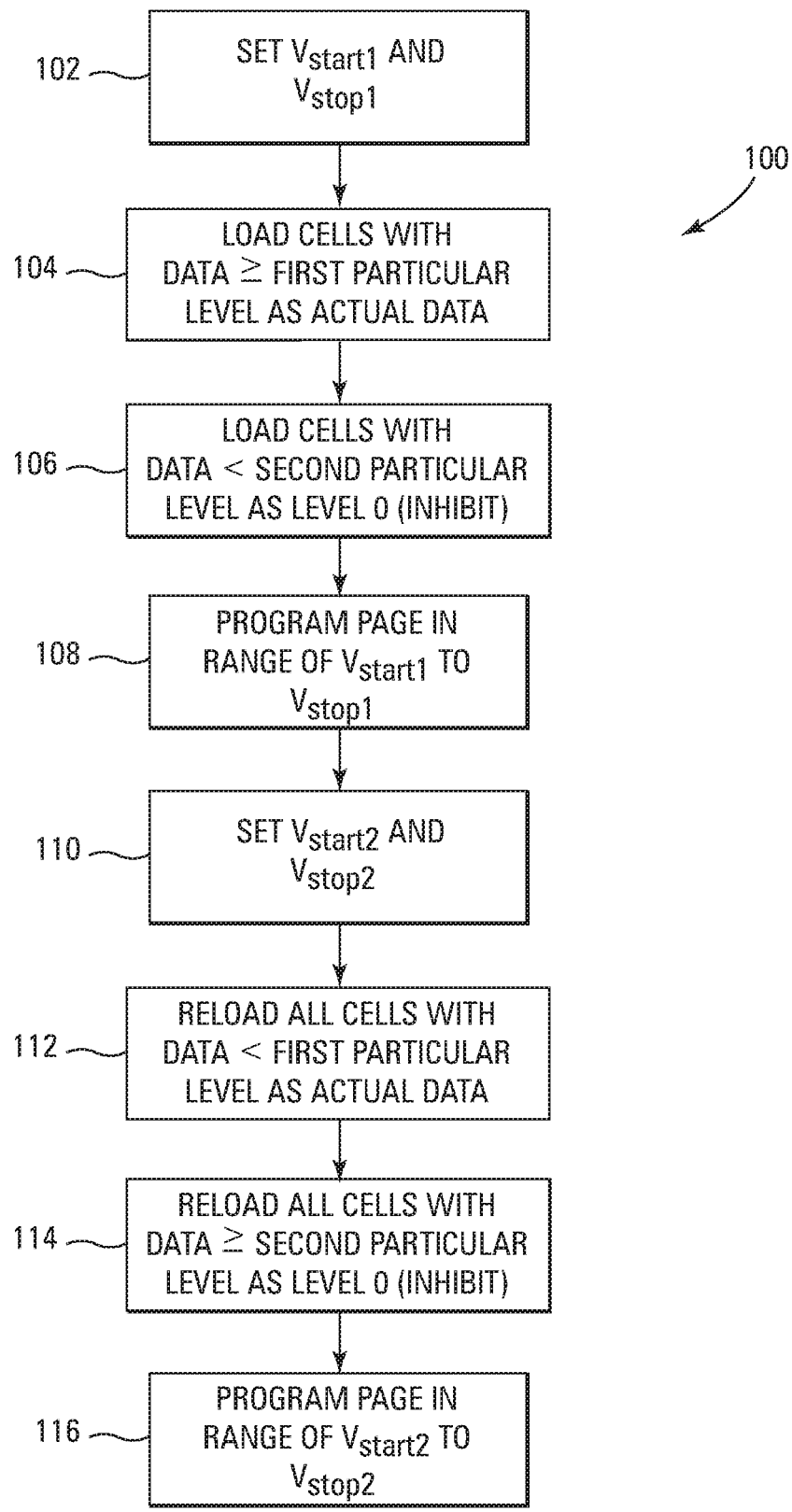
FIG. 1 is a flow chart diagram of a method according to one embodiment of the present invention.

In the following detailed description of the embodiments, reference is made to the accompanying drawings that form a part hereof. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present disclosure is defined only by the appended claims, along with the full scope of equivalents to which such claims are entitled.

The various embodiments disclosed herein include split data programming methods for reducing cell disturb in programming, and memories and systems with which the methods may be practiced.

A method 100 of programming a memory is shown in FIG. 1. Method 100 comprises setting a first start program voltage and a first stop program voltage in block 102, loading data for cells to be programmed to a level greater than or equal to a first particular level with actual data to be programmed in block 104, and loading data for cells to be programmed to a level less than a second particular level with an inhibit level in block 106. Following loading of the data as described in blocks 102 and 104, the memory is programmed in block 108 with program pulses in a first range from the first start program voltage to the first stop program voltage. A second start program voltage and a second stop program voltage are set in block 110. The method continues with re-loading data for cells to be programmed to a level less than the first particular level with an inhibit level in block 112, and re-loading data for cells to be programmed to a level greater than or equal to the second particular level with actual data to be programmed in block 114. Following the re-loading of data as described in blocks 112 and 114, the memory is programmed with program pulses in a second range from the second start program voltage to the second stop program voltage in block 116. Programming continues with a repeat of the method 100 until all pages of a block, or all blocks of the memory, are programmed.

Figure 2:
FIG. 2 is a table showing parameters of a first variation of the method of FIG. 1.

In a first variation of method 100, referred to herein as a voltage overlap method, the first range of voltages used for programming pulses overlaps the second range of voltages used for programming pulses. Typical programming for a 16 level memory programs with a series of programming pulses beginning at 12 volts and ending at 24 volts, using 0.5 volt intervals, for a total of 24 programming pulses. The problem with this is that the levels that initially program do so at lower voltages, and are subjected to disturb from program pulses at higher voltages. The greater the number of pulses, and the greater the level of those pulses, the greater the disturb to cells that program at the lower levels. Typical programming parameters for the first variation 200 are shown in FIG. 2.

In the voltage overlap embodiment, the cells that are to be programmed, typically a page at a time, are split into two different groups of cells. Those cells that are to be programmed at higher levels, that is levels that are programmed using higher voltage pulses, are programmed first, using a range of programming pulses that are used to program those higher levels, with some voltage overlap to lower voltage program pulses to program cells that program quickly. During that phase of programming, cells that are to be programmed at lower levels, that is levels that are programmed using lower voltage pulses, have the data for their levels loaded into data latches of the memory as level 0, and are therefore inhibited from programming.

In one embodiment, cells of a 16 level memory that are to be programmed to any of levels 8-15 (1000-1111) have data loaded into the data latches that is the actual data that corresponds to those levels, which are typically programmed with program pulses from 18 volts to 24 volts. To program cells at level 8 that may be cells that program faster, that is cells that may program with lower than a typical voltage pulse for level 8, an overlap of program pulse voltage is used. In this embodiment, programming pulses start at 17 volts instead of a typical 18 volts, and the programming sequence for the cells at levels 8-15 uses pulses from 17 to 24 volts. Because the cells to be programmed to levels 0-7 (0000-0111) are loaded with data 0000, indicating level 0, they are effectively inhibited from programming, and this data is not yet written to be disturbed by the programming pulses that are used to program those cells being programmed to data levels 8-15, and are not affected to the extent of causing a data error.

Once the cells having data at levels 8-15 are programmed, the cells in the group of cells to be programmed are re-loaded, with data for all cells to be programmed to levels 0-7 being loaded with the actual data, and data for all cells to be programmed to levels 8-15 being loaded with data 0000, indicating level 0, effectively inhibiting those cells. In one embodiment, cells of a 16 level memory that are to be programmed to any of levels 0-7 (0000-0111) have data loaded into the data latches that is the actual data that corresponds to those levels, which are typically programmed with program pulses from 12 volts to 18 volts. To program cells at level 7 that may be slower to program, that is they may program at a higher than typical voltage for level 7, an overlap of program pulse voltage is used.

In this embodiment, programming pulses start at 12 volts, and extend through a range from 12 volts to 19 volts instead of a typical 18 volts for levels 0-7. Because the cells to be programmed to levels 8-15 are loaded with data 0000, indicating level 0, they are effectively inhibited from programming. In this way, the cells to be programmed to levels 0-7 are only subjected to program disturb for programming pulses up to 19 volts, instead of being subjected to program disturb for programming pulses up to 24 volts.

This embodiment uses program pulses in two overlapping ranges, so an additional four voltage pulses are used, slowing programming but reducing disturb in lower level cells.

With respect to the method 100 described above, the first variation has a first start program voltage of 17 volts, a first stop program voltage of 24 volts, a first particular level of level 8, a second start program voltage of 12 volts, a second stop program voltage of 19 volts, and a second particular level of level 7.

Figure 3:
FIG. 3 is a table showing parameters of a second variation of the method of FIG. 1.

In a second variation of method 1, referred to herein as a data overlap method, the first particular level overlaps the second particular level, that is the first particular level is a level typically programmed using a lower voltage program pulse, and the second particular level is a level typically programmed using a higher voltage program pulse. Typical programming parameters for the second variation 300 are shown in FIG. 3.

In the data overlap embodiment, the cells that are to be programmed, typically a page at a time, are split into two different groups of cells. Those cells that are to be programmed at higher levels, that is levels that are programmed using higher voltage pulses, are programmed first, using a range of programming pulses that are used to program those higher levels, with some level overlap to lower levels to address cells that program quickly. During that phase of programming, cells that are to be programmed at lower levels, that is levels that are programmed using lower voltage pulses, have the data for their levels loaded into data latches of the memory as level 0, and are therefore inhibited from programming.

In a memory in which all cells program at their typical levels, cells being programmed in a range from levels 8-15 would program with voltage pulses from 18 to 24 volts, and cells being programmed in a range from levels 0-7 would program with voltage pulses from 12 to 18 volts. A problem exists in that some cells that program fast at level 8, that is that program at a voltage that is lower than the typical voltage at which cells are programmed to level 8, can be over-programmed and exhibit runaway programming when subjected to a voltage pulse of 18 volts. This has been addressed in one way with variation one described above.

In the second variation, instead of overlapping voltage ranges, typical voltage ranges for levels 8-15 and 0-7 are used, that is 18-24 volts and 12-18 volts, respectively. However, data levels are overlapped during programming. In a first programming sequence, the first particular level is level 7. That is, cells to be programmed to any of levels 7-15 have data loaded to the data latches that is the actual data that corresponds to those levels in the first part of the programming, with data for cells to be programmed to levels 0-6 loaded with data 0000, indicating level 0, effectively inhibiting those cells. The cells are programmed with a first range of program voltage pulses in a range from 18 volts to 24 volts. By loading data for cells to be programmed to level 7, the first 18 volt pulse allows for programming of those cells to be programmed to level 7 that may program slow, that is that may program at a voltage higher than the typical 17 to 17.5 volts typically used to program cells to level 7.

Once the cells having data at levels 7-15 are programmed, the cells in the group of cells to be programmed are re-loaded, with data for all cells to be programmed to levels 0-9 being loaded with the actual data, and data for all cells to be programmed to levels 10-15 being loaded with data 0000, indicating level 0, effectively inhibiting those cells. The cells are programmed with a second range of program voltage pulses in a range from 12 volts to 18 volts. Re-loading data for cells to be programmed to levels 0-9 results in subjecting cells at levels 7, 8, and 9 to programming pulses in each set of programming pulses. However, any cells to be programmed to any of levels 7, 8, or 9 that have already been programmed sufficiently to the appropriate level are inhibited after verification. Programming in the second range of program voltage pulses in a range of 12 volts to 18 volts but using levels 7, 8, and 9 allows programming of cells that may program faster than typical cells at levels 8 and 9 to be programmed. This variation uses the same number of voltage pulses as typical programming from 12 to 24 volts, but reduces disturb on cells the be programmed to lower levels since those cells are only subjected to voltages up to 18 volts instead of up to 24 volts.

In the second variation, the level overlap ensures proper programming, but programs more cells. In a memory in which all or substantially all of the memory cells program similarly, that is there are very few fast or very few slow programming cells, the second variation may use fewer overlap levels, or even none at all.

With respect to the method 100 described above, the second variation has a first start program voltage of 18 volts, a first stop program voltage of 24 volts, a first particular level of level 7, a second start program voltage of 12 volts, a second stop program voltage of 18 volts, and a second particular level of level 9.

In the first variation, the voltage overlap ensures proper programming but uses additional voltage pulses. In the second variation, the level overlap ensures proper programming. The closer the cells of a memory get to being programmable neither fast or slow, the closer the first and second variations approach each other. In a perfect memory, the method 100 uses a first start program voltage of 18 volts, a first stop program voltage of 24 volts, a first particular level of 8, a second start program voltage of 12 volts, a second stop program voltage of 18 volts, and a second particular level of 7.

Figure 4:
FIG. 4 is a table showing parameters of a third variation of the method of FIG. 1.

However, since memories are not perfect, for example some cells that program fast can still pose problems, but not problems so significant as to make either variation a most efficient choice for a programming method. Therefore, in a third variation, a combination of the first two variations is used. In the third variation, parameters are chosen to overcome some of the fast programming cells of level 7. That is, the first and second voltage ranges overlap as in the first variation but not to the same extent, and the data levels overlap as in the second variation but not to the same extent. For example, in the third variation, with respect to the method 100 described above, the third variation has a first start program voltage of 17.5 volts, a first stop program voltage of 24 volts, a first particular level of level 7, a second start program voltage of 12 volts, a second stop program voltage of 18.5 volts, and a second particular level of level 7. Typical programming parameters for the third variation 400 are shown in FIG. 4.

Application of the third variation is largely dependent upon technology, and depends in part upon whether the memory device on which the variation is used has predominantly fast or slow programming cells. For example, if the memory has cells that are predominantly fast programming, the combination of the third variation can be made closer to the first variation, and if the memory has cells that are predominantly slow programming, the combination of the third variation can be made closer to the second variation. Further, as distributions for cell level programming tighten, that is as actual distributions more closely approach theoretical distributions, the third variation can be made closer to the second variation. For the third variation, it is determined whether there is a typical fast or slow cell programming issue, and the parameters are adjusted accordingly.

It should be understood that voltage ranges, the number of program pulses, the size of the difference in voltage between consecutive program pulses, the number of levels being programmed in the memory, the number of sets of programming pulses used, and the like may be varied without departing from the scope of the disclosure, and such variations are well within the scope of knowledge of those of skill in the art. Further, while specific levels and voltage ranges are illustrated herein, while programming a sequence of cells from level 0 to level 15, with a threshold voltage distribution having levels between for example −2 volts to +3 volts, with equal or unequal levels, other ranges of levels, other numbers of programming sets with varying level and/or voltage ranges, or other threshold voltage distributions may be used without departing from the scope of the embodiments. Also, ranges may be split, for example, into top halves and bottom halves within the range, or approximately top and bottom halves, or approximately more than or less than top and bottom halves, without departing from the scope of the invention.

Figure 4A:
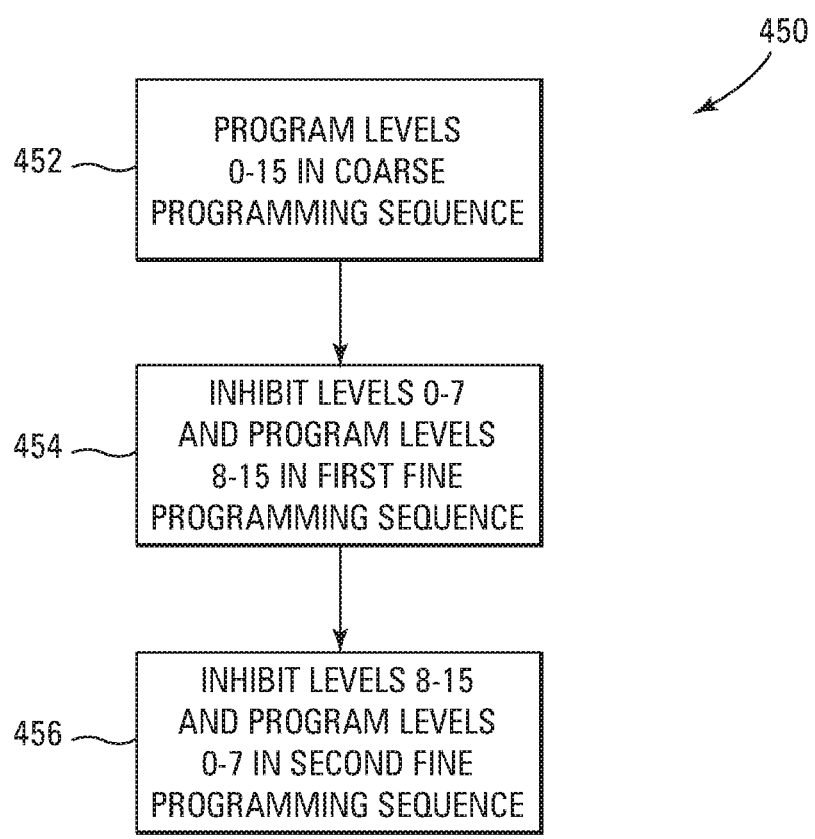
FIG. 4A is a flow chart diagram of a method according to another embodiment of the present invention.

The various embodiments have been described herein with respect to programming methods using a single type of programming. However, the various embodiments can also be used as a refinement for a coarse/fine programming sequence, such as that described in application Ser. No. 11/818,683, filed Jun. 15, 2007, which is commonly owned, for the fine programming portion of coarse fine programming. Further, the various embodiments can also be used as a refinement of the coarse programming sequence of a coarse/fine or even a coarse/coarse programming, although the benefits are reduced somewhat when the various embodiments are used with coarse programming. This method 450 is shown in the flow chart of FIG. 4A. Method 450 for coarse/fine programming comprises programming all cells at all levels 0-15 in a first coarse programming sequence in block 452, inhibiting levels 0-7 and programming levels 8-15 in a first fine programming sequence in block 454, and inhibiting levels 8-15 and programming levels 0-7 in a second fine programming sequence.

In the various embodiments, disturb is reduced using a split data algorithm and programming sequence. The data is programmed in two or more sequences of programming pulses with data requiring higher programming voltages programmed first. During each programming sequence, the data which is not being currently selected for programming is inhibited. This may be implemented in a memory controller by having the controller send two streams of data in which data not currently being programmed are inhibited by sending data representing erased cells.

Figure 5:
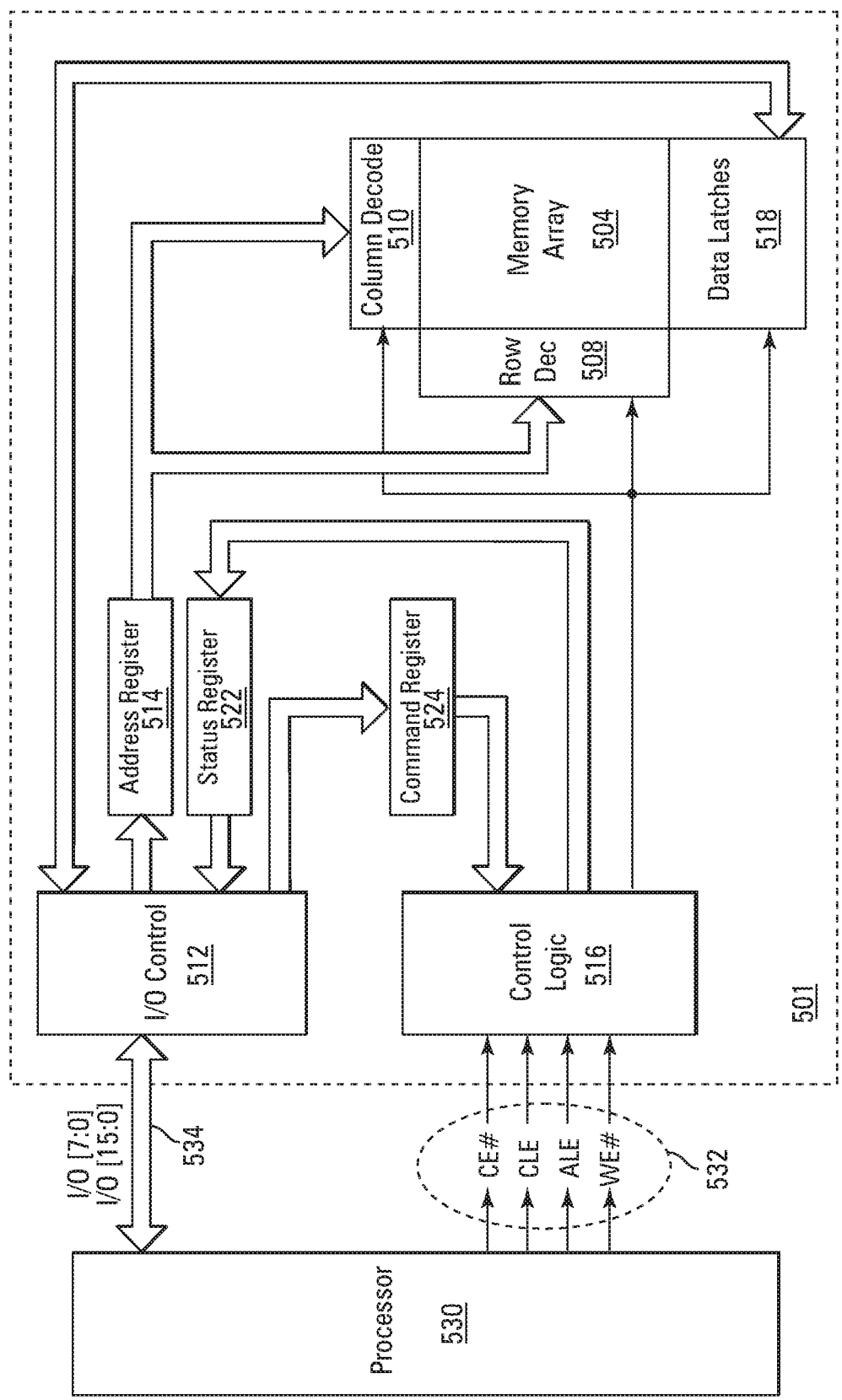
FIG. 5 is a functional block diagram of an electrical system having at least one memory device with a memory array configuration according to one embodiment of the present invention.

FIG. 5 is a simplified block diagram of a memory device 501 according to an embodiment of the disclosure, and on which various embodiments of the disclosure are practiced. Memory device 501 includes an array of memory cells 504 arranged in rows and columns. Although the various embodiments will be described primarily with reference to NAND memory arrays, the various embodiments are not limited to a specific architecture of the memory array 504. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 508 and a column decode circuitry 510 are provided to decode address signals provided to the memory device 501. Address signals are received and decoded to access memory array 504. Memory device 501 also includes input/output (I/O) control circuitry 512 to manage input of commands, addresses and data to the memory device 501 as well as output of data and status information from the memory device 501. An address register 514 is coupled between I/O control circuitry 512 and row decode circuitry 508 and column decode circuitry 510 to latch the address signals prior to decoding. A command register 524 is coupled between I/O control circuitry 512 and control logic 516 to latch incoming commands. Control logic 516 controls access to the memory array 504 in response to the commands and generates status information for the external processor 530. The control logic 516 is coupled to row decode circuitry 508 and column decode circuitry 510 to control the row decode circuitry 508 and column decode circuitry 510 in response to the addresses.

Control logic 516 is also coupled to a sample and hold circuitry 518. The sample and hold circuitry 518 latches data, either incoming or outgoing, in the form of analog voltage signals. For example, the sample and hold circuitry could contain capacitors or other analog storage devices for sampling either an incoming voltage signal representing data to be written to a memory cell or an outgoing voltage signal indicative of the threshold voltage sensed from a memory cell. The sample and hold circuitry 518 may further provide for amplification and/or buffering of the sampled voltage to provide a stronger data signal to an external device.

The handling of analog voltage signals may take an approach similar to an approach well known in the area of CMOS imager technology, where charge levels generated at pixels of the imager in response to incident illumination are stored on capacitors. These charge levels are then converted to voltage signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a voltage level indicative of an actual or target threshold voltage of a memory cell for reading or programming, respectively, the memory cell. This charge could then be converted to an analog voltage using a differential amplifier having a grounded input or other reference signal as a second input. The output of the differential amplifier could then be passed to the I/O control circuitry 512 for output from the memory device, in the case of a read operation, or used for comparison during one or more verify operations in programming the memory device. It is noted that the I/O control circuitry 512 could optionally include analog-to-digital conversion functionality and digital-to-analog conversion (DAC) functionality to convert read data from an analog signal to a digital bit pattern and to convert write data from a digital bit pattern to an analog signal such that the memory device 501 could be adapted for communication with either an analog or digital data interface.

During a write operation, target memory cells of the memory array 504 are programmed, for example using two sets of programming pulses as described above, until voltages indicative of their Vt levels match the levels held in the sample and hold circuitry 518. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the Vt levels of the target memory cells are passed to the sample and hold circuitry 518 for transfer to an external processor (not shown in FIG. 5) either directly as analog signals or as digitized representations of the analog signals depending upon whether ADC/DAC functionality is provided external to, or within, the memory device.

Threshold voltages of cells may be determined in a variety of manners. For example, an access line, such as those typically referred to as word lines, voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 518 may include caching, i.e., multiple storage locations for each data value, such that the memory device 501 may be reading a next data value while passing a first data value to the external processor, or receiving a next data value while writing a first data value to the memory array 504. A status register 522 is coupled between I/O control circuitry 512 and control logic 516 to latch the status information for output to the external processor.

Memory device 501 receives control signals at control logic 516 over a control link 532. The control signals may include a chip enable CE #, a command latch enable CLE, an address latch enable ALE, and a write enable WE #. Memory device 501 may receive commands (in the form of command signals), addresses (in the form of address signals), and data (in the form of data signals) from an external processor over a multiplexed input/output (I/O) bus 534 and output data to the external processor over I/O bus 534.

In a specific example, commands are received over input/output (I/O) pins [7:0] of I/O bus 534 at I/O control circuitry 512 and are written into command register 524. The addresses are received over input/output (I/O) pins [7:0] of bus 534 at I/O control circuitry 512 and are written into address register 514. The data may be received over input/output (I/O) pins [7:0] for a device capable of receiving eight parallel signals, or input/output (I/O) pins [15:0] for a device capable of receiving sixteen parallel signals, at I/O control circuitry 512 and are transferred to sample and hold circuitry 518. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 5 has been simplified to help focus on the embodiments of the disclosure.

A program function on selected cells, blocks, pages, or the like of the memory 500 is performed as described above with respect to FIGS. 1-4.

While FIG. 5 has been described with respect to sample and hold circuitry 518, it should be understood that the control logic 516 could be coupled to data latches instead of sample and hold circuitry 518 without departing from the scope of the disclosure. Data latches latch data, either incoming or outgoing. During a write operation, target memory cells of the memory array 504 are programmed, for example using two sets of programming pulses as described above, until voltages indicative of their Vt levels match the data held in the data latches. This can be accomplished, as one example, using differential sensing devices to compare the held data to a threshold voltage of the target memory cell.

Additionally, while the memory device of FIG. 5 has been described in accordance with popular conventions for receipt and output of the various signals, it is noted that the various embodiments are not limited by the specific signals and I/O configurations described unless expressly noted herein. For example, command and address signals could be received at inputs separate from those receiving the data signals, or data signals could be transmitted serially over a single I/O line of I/O bus 534. Because the data signals represent bit patterns instead of individual bits, serial communication of an 8-bit data signal could be as efficient as parallel communication of eight signals representing individual bits.

Memory devices of the various embodiments may be advantageously used in bulk storage devices. For various embodiments, these bulk storage devices may take on the same form factor and communication bus interface of traditional HDDs, thus allowing them to replace such drives in a variety of applications. Some common form factors for HDDs include the 3.5", 2.5" and PCMCIA (Personal Computer Memory Card International Association) form factors commonly used with current personal computers and larger digital media recorders, as well as 1.8" and 1" form factors commonly used in smaller personal appliances, such as mobile telephones, personal digital assistants (PDAs) and digital media players. Some common bus interfaces include universal serial bus (USB), AT attachment interface (ATA) [also known as integrated drive electronics or IDE], serial ATA (SATA), small computer systems interface (SCSI) and the Institute of Electrical and Electronics Engineers (IEEE) 1394 standard. While a variety of form factors and communication interfaces were listed, the embodiments are not limited to a specific form factor or communication standard. Furthermore, the embodiments need not conform to a HDD form factor or communication interface.

CONCLUSION

Methods of programming a memory and memories using the methods have been described that, among other things, reduce disturb on lower program voltage data cells, and include programming in two or more steps, the first step programming a first plurality of cells of a set of levels typically programmed with higher programming voltage pulses while inhibiting a second plurality of cells of a set of levels typically programmed with lower voltage programming voltage pulses, using a first set of programming pulses in a first range of programming pulse voltages, in a first part of programming, and programming a third plurality of cells of a set of levels typically programmed with lower voltage programming pulses while inhibiting a fourth plurality of cells of a set of levels typically programmed with higher programming voltage pulses, using a second set of programming pulses in a second range of programming pulse voltages, in a second part of the programming. The range of levels programmed in each part of the programming, and the range of voltages used for the programming pulses, differs depending upon variations in the operation of the memory upon which the programming method is used.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A memory, comprising:
an array of memory cells; and
control logic;
wherein the control logic is configured to cause the memory to:
for each memory cell of a first subset of memory cells of a plurality of memory cells selected for programming during a programming operation, inhibit that memory cell from programming during each programming pulse of a first plurality of programming pulses of the programming operation and enable that memory cell for programming for at least one programming pulse of a second plurality of programming pulses of the programming operation;
for each memory cell of a second subset of memory cells of the plurality of memory cells, inhibit that memory cell from programming during each programming pulse of the second plurality of programming pulses and enable that memory cell for programming for at least one programming pulse of the first plurality of programming pulses; and
for each memory cell of a third subset of memory cells of the plurality of memory cells, enable that memory cell for programming during at least one programming pulse of the first plurality of programming pulses and during at least one programming pulse of the second plurality of programming pulses;
wherein the first subset of memory cells, the second subset of memory cells, and the third subset of memory cells are each mutually exclusive of one another; and
wherein a union of the first subset of memory cells, the second subset of memory cells, and the third subset of memory cells contains each memory cell of the plurality of memory cells.

2. The memory of claim 1, wherein the plurality of memory cells is a first plurality of memory cells of a page of memory cells selected for programming during the programming operation, and wherein the controller is further configured to cause the memory to:
for each memory cell of a second plurality of memory cells of the page of memory cells, inhibit that memory cell from programming during each programming pulse of the first plurality of programming pulses and during each programming pulse of the second plurality of programming pulses.

3. The memory of claim 1, wherein the controller is further configured to cause the memory to:
apply the first plurality of programming pulses to a respective control gate of each memory cell of the first subset of memory cells, the second subset of memory cells, and the third subset of memory cells; and
apply the second plurality of programming pulses to the respective control gate of each memory cell of the first subset of memory cells, the second subset of memory cells, and the third subset of memory cells.

4. The memory of claim 3, wherein the first plurality of programming pulses has a first range of voltage levels, wherein the second plurality of programming pulses has a second range of voltage levels lower than the first range of voltage levels, wherein a lowest voltage level of the first range of voltage levels is lower than or equal to a highest voltage level of the second range of voltage levels, and wherein the controller is further configured to cause the memory to apply the first plurality of programming pulses prior to applying the second plurality of programming pulses.

5. The memory of claim 1, wherein each programming pulse of the first plurality of programming pulses has a respective voltage level in a range from a first voltage level to a second voltage level that is higher than the first voltage level, wherein each programming pulse of the second plurality of programming pulses has a respective voltage level in a range from a third voltage level to a fourth voltage level that is higher than the third voltage level, wherein the third voltage level is lower than the first voltage level, and wherein the fourth voltage level is higher than or equal to the first voltage level.

6. The memory of claim 5, wherein each memory cell of the first subset of memory cells has a respective desired data level for the programming operation that is lower than a respective desired data level for the programming operation of each memory cell of the second subset of memory cells.

7. The memory of claim 6, wherein each memory cell of the third subset of memory cells has a respective desired data level for the programming operation that is lower than the respective desired data level for the programming operation of each memory cell of the second subset of memory cells, and that is higher than the respective desired data level for the programming operation of each memory cell of the first subset of memory cells.

8. The memory of claim 7, wherein each memory cell of the third subset of memory cells has a same respective desired data level.

9. A memory, comprising:
an array of memory cells; and
control logic;
wherein the control logic is configured to cause the memory to:
for each memory cell of a first subset of memory cells of a plurality of memory cells selected for programming during a programming operation, inhibit that memory cell from programming during each programming pulse of a first plurality of programming pulses of the programming operation and enable that memory cell for programming for at least one programming pulse of a second plurality of programming pulses of the programming operation;
for each memory cell of a second subset of memory cells of the plurality of memory cells, inhibit that memory cell from programming during each programming pulse of the second plurality of programming pulses and enable that memory cell for programming for at least one programming pulse of the first plurality of programming pulses; and
for each memory cell of a third subset of memory cells of the plurality of memory cells, enable that memory cell for programming during at least one programming pulse of the first plurality of programming pulses and during at least one programming pulse of the second plurality of programming pulses;
wherein the first subset of memory cells, the second subset of memory cells, and the third subset of memory cells are each mutually exclusive of one another;
wherein a union of the first subset of memory cells, the second subset of memory cells, and the third subset of memory cells contains each memory cell of the plurality of memory cells;
wherein each memory cell of the plurality of memory cells has a respective desired data level of a plurality of data levels for the programming operation;
wherein the respective desired data level of each memory cell of the first subset of memory cells is lower than the respective desired data level of each memory cell of the second subset of memory cells; and
wherein the respective desired data level of each memory cell of the third subset of memory cells is lower than the respective desired data level of each memory cell of the second subset of memory cells, and higher than the respective desired data level of each memory cell of the first subset of memory cells.

10. The memory of claim 9, wherein the respective desired data state of a particular memory cell of the third subset of memory cells is different than the respective desired data state of a different memory cell of the third subset of memory cells.

11. The memory of claim 10, wherein the respective desired data state of an additional memory cell of the third subset of memory cells is different than the respective desired data state of the particular memory cell of the third subset of memory cells, and different than the respective desired data state of the different memory cell of the third subset of memory cells.

12. A memory, comprising:
an array of memory cells; and
control logic;
wherein the control logic is configured to cause the memory to:
apply a first plurality of programming pulses to control gates of a plurality of memory cells selected for a programming operation, wherein each programming pulse of the first plurality of programming pulses has a respective voltage level in a range from a first voltage level to a second voltage level that is higher than the first voltage level;
after applying the first plurality of programming pulses to the control gates of the plurality of memory cells, apply a second plurality of programming pulses to the control gates of the plurality of memory cells, wherein each programming pulse of the second plurality of programming pulses has a respective voltage level in a range from a third voltage level to a fourth voltage level that is higher than the third voltage level, wherein the third voltage level is lower than the first voltage level, and wherein the fourth voltage level is higher than or equal to the first voltage level;
for each memory cell of the plurality of memory cells having a respective desired threshold voltage lower than a first particular threshold voltage, inhibit that memory cell from programming for each programming pulse of the first plurality of programming pulses and enable that memory cell for programming for at least one programming pulse of the second plurality of programming pulses; and for each memory cell of the plurality of memory cells having its respective desired threshold voltage higher than a second particular threshold voltage that is higher than or equal to the first particular threshold voltage, inhibit that memory cell from programming for each programming pulse of the second plurality of programming pulses and enable that memory cell for programming for at least one programming pulse of the first plurality of programming pulses.

13. The memory of claim 12, wherein the controller is further configured to cause the memory to:
for each memory cell of the plurality of memory cells having its respective desired threshold voltage equal to the second particular threshold voltage, enable that memory cell for programming for at least one programming pulse of the first plurality of programming pulses and inhibit that memory cell from programming for each programming pulse of the second plurality of programming pulses.

14. The memory of claim 13, wherein the second particular threshold voltage is equal to the first particular threshold voltage.

15. The memory of claim 12, wherein the second particular threshold voltage is higher than the first particular threshold voltage.

16. The memory of claim 15, wherein the controller is further configured to cause the memory to:
for each memory cell of the plurality of memory cells having its respective desired threshold voltage lower than the second particular threshold voltage and higher than or equal to the first particular threshold voltage, enable that memory cell for programming for at least one programming pulse of the first plurality of programming pulses and enable that memory cell for programming for at least one programming pulse of the second plurality of programming pulses.

17. The memory of claim 16, wherein a range of threshold voltages lower than the second particular threshold voltage and higher than or equal to the first particular threshold voltage corresponds to a particular data state of a plurality of data states of the programming operation, and wherein no threshold voltage lower than the second particular threshold voltage and higher than or equal to the first particular threshold voltage corresponds to a data state of the plurality of data states other than the particular data state.

18. The memory of claim 16, wherein a first range of threshold voltages lower than the second particular threshold voltage and higher than or equal to the first particular threshold voltage corresponds to one data state of a plurality of data states of the programming operation, and wherein a second range of threshold voltages lower than the second particular threshold voltage and higher than or equal to the first particular threshold voltage, and mutually exclusive of the first range of threshold voltages, corresponds to a different data state of the plurality of data states of the programming operation.

19. The memory of claim 18, wherein each threshold voltage of the second range of threshold voltages is higher than each threshold voltage of the first range of threshold voltages.

20. The memory of claim 19, wherein a third range of threshold voltages lower than the second particular threshold voltage and higher than or equal to the first particular threshold voltage corresponds to a further data state of the plurality of data states of the programming operation, and wherein each threshold voltage of the third range of threshold voltages is higher than each threshold voltage of the second range of threshold voltages.

21. The memory of claim 12, wherein each memory cell of the plurality of memory cells having its respective desired threshold voltage lower than the first particular threshold voltage comprises each memory cell of the plurality of memory cells having a respective desired data level lower than a first particular data level, and wherein each memory cell of the plurality of memory cells having its respective desired threshold voltage higher than the second particular threshold voltage comprises each memory cell of the plurality of memory cells having a respective desired data level higher than or equal to a second particular data level that is higher than or equal to the first particular data level.

* * * * *